(12) United States Patent
Truppel et al.

(10) Patent No.: US 7,705,643 B2
(45) Date of Patent: Apr. 27, 2010

(54) DEVICE AND METHOD FOR PHASE SYNCHRONIZATION WITH THE AID OF A MICROCONTROLLER

(76) Inventors: Ingo Truppel, Franz-Mehring-Str. 51, Potsdam (DE) D-14482; Klaus Bienert, Am Scheunenplatz 3, Gross Kreutz (DE) D-14550

( * ) Notice: Subject to any disclaimer, the term of this patent is extended or adjusted under 35 U.S.C. 154(b) by 222 days.

(21) Appl. No.: 11/720,593

(22) PCT Filed: Nov. 22, 2005

(86) PCT No.: PCT/EP2005/056152

§ 371 (c)(1),
(2), (4) Date: Dec. 7, 2007

(87) PCT Pub. No.: WO2006/058853

PCT Pub. Date: Jun. 8, 2006

(65) Prior Publication Data

US 2008/0197896 A1    Aug. 21, 2008

(30) Foreign Application Priority Data

Dec. 1, 2004    (DE) .................. 10 2004 058 100
Apr. 18, 2005    (DE) .................. 10 2005 018 950

(51) Int. Cl.
*H03L 7/06*    (2006.01)
(52) U.S. Cl. ...................................... 327/158; 327/159
(58) Field of Classification Search .......... 327/156, 327/158, 159
See application file for complete search history.

(56) References Cited

U.S. PATENT DOCUMENTS 4,853,841 A    8/1989    Richter et al.

(Continued)

FOREIGN PATENT DOCUMENTS

EP    0 081 835    6/1983

(Continued)

OTHER PUBLICATIONS

PCT International Preliminary Report on Patentability issued Jun. 5, 2007, in corresponding International Application No. PCT/EP2005/056152.

(Continued)

*Primary Examiner*—Lincoln Donovan
*Assistant Examiner*—Ryan C Jager
(74) *Attorney, Agent, or Firm*—Woodcock Washburn LLP

(57) ABSTRACT

The phase controller device according to the invention comprises a hardware core that is formed by a signal detector, a voltage-controlled oscillator, a phase comparator, and an integration unit, where the hardware core, by controlling the working clock pulse frequency of the microcontroller, brings an output clock pulse signal that is generated by a microcontroller into phase with the input clock pulse information that is received from the input data stream, and does so in such a manner that the jitter is low. The microcontroller executes a program with this working clock pulse, where with that program the microcontroller generates the output clock pulse signal with an output clock pulse frequency that is in a predetermined division ratio to the control clock pulse frequency that is generated by the voltage-controlled oscillator and is given to the microcontroller as a working clock pulse frequency. In this way the program enables the phase controller device according to the invention to process, with a microcontroller, external periodic signals, data, or events, where the software processes taking place in the microcontroller are always locked in phase with the periodic occurrence of these external signals, data, or events.

19 Claims, 6 Drawing Sheets

U.S. PATENT DOCUMENTS

| | | | | |
|---|---|---|---|---|
| 4,853,847 A | | 8/1989 | Ohuchi | 713/600 |
| 5,387,913 A | | 2/1995 | Park et al. | 341/155 |
| 6,041,090 A | * | 3/2000 | Chen | 375/376 |
| 6,307,441 B1 | * | 10/2001 | Sharpe | 332/100 |
| 6,650,186 B1 | * | 11/2003 | Sommer et al. | 331/11 |
| 6,815,987 B2 | * | 11/2004 | Hsu et al. | 327/156 |
| 7,042,252 B2 | * | 5/2006 | Galloway et al. | 327/16 |
| 2005/0213696 A1 | * | 9/2005 | Totsuka et al. | 375/376 |

FOREIGN PATENT DOCUMENTS

| | | |
|---|---|---|
| EP | 0 556 984 | 7/1997 |
| EP | 0 840 458 | 11/2003 |
| WO | WO 2006/058853 | 6/2006 |

OTHER PUBLICATIONS

PCT International Search Report mailed Feb. 6, 2006, in corresponding International Application No. PCT/EP2005/056152.

* cited by examiner

US 7,705,643 B2

DEVICE AND METHOD FOR PHASE SYNCHRONIZATION WITH THE AID OF A MICROCONTROLLER

CROSS-REFERENCE TO RELATED APPLICATIONS

This application is the National Stage of International Application No. PCT/EP2005/056152, filed 22 Nov. 2005, which claims the benefit of German Application No. 10 2004 058 100.2 filed 1 Dec. 2004, and German Application No. 10 2005 018 950.4 filed 18 Apr. 2005, the disclosures of which are incorporated herein by reference in their entirety.

The invention relates to a method and a device for the phase-locked synchronization of an output clock pulse signal with an input signal that represents a continuous serial input data stream comprising input clock pulse information and content data. Furthermore, the invention relates to a receiver with such a device.

The transmission of a serial digital data stream from a transmitter to a receiver requires the synchronization of the receiver with clock pulse information that is comprised in the transmitted data stream, such synchronization being required in order to be able to reproduce the transmitted data. For this purpose phase controller devices are used that, in English, are also called phase-locked loops (PLL).

From EP 0 556 984 B1 a phase-locked loop for synchronizing a serial data bit stream is known in which an input signal and a bit clock pulse signal that is generated by a voltage-controlled oscillator are fed to a phase comparator. The phase comparator generates, as a function of the phase difference of the signals present at the inputs of the phase comparator, an error signal that, depending on the result of the comparison, causes a low-pass filter connected in outgoing circuit to increase or decrease a control voltage present at a voltage-controlled oscillator.

A disadvantage of this known control device is the fact that such a phase controller device is relatively inflexible due to its embodiment in hardware.

If an external microcontroller is coupled to a clock pulse generator, as is known from EP 0 556 984 B1, then the synchronization is done by software stored and executed therein via interrupts or polling (cyclic query). This requires a complicated software design since it must make it possible to be able to handle interrupts of this type in a timely manner.

Such a method is known from EP 0 840 458 B1. Therein the external microcontroller is outside of the phase-locked loop and gives the division ratio, corresponding to a manual input signal, to a programmable frequency divider. The frequency divider divides the signal of a voltage-controlled oscillator. The output clock pulse signal of the frequency divider is fed to an input of a phase detector. At the other input of the phase detector a reference clock pulse signal with a fixed reference frequency is present.

Furthermore, it is a known practice to embody a phase controller device as a so-called software PLL, which is realized by a program executed by a microcontroller. The microcontroller compares the temporal occurrence of the synchronous clock pulse signal present at one input to an expected temporal occurrence and changes variable values in such a manner that the expected temporal occurrence agrees with the actual synchronous clock pulse signal. A disadvantage of such a form of realization of a PLL is the fact that the controller, due to the time needed for the execution of the program stored in it, must operate at a particularly high clock pulse frequency. This makes particularly great demands on the performance of the microcontroller, which thus requires more energy for its operation and is more time-consuming and more expensive to acquire. Furthermore, in phase controller devices of this type an unforeseeable phase error, on the order of magnitude of at most the time required for processor to execute a single command, appears as a source of jitter, which leads to additional phase noise.

Finally, it is a practice known from U.S. Pat. No. 5,387,913 to implement, in a single integrated circuit, a phase controller device together with a digital signal processor that provides a manual input signal to specify a tuning frequency of a radio receiver.

The present invention is based on the technical problem of specifying a phase controller device that is also suitable for input signals with clock pulse frequencies that are high relative to the processing speed of the microcontroller used and that mitigates or eliminates the described disadvantages of the state of the art.

According to a first aspect of the invention the objective is realized by a phase controller device for phase-locked synchronization of an output clock pulse signal with an input signal that represents a serial input data stream comprising input clock pulse information and content data, where the phase controller device comprises a signal detector that is formed to receive an externally derived input signal that comprises input clock pulse information and is formed to output a synchronous clock pulse signal that is synchronous with the input clock pulse information, a voltage-controlled oscillator that is formed to issue a control clock pulse signal with a control clock pulse frequency that is proportional to a control voltage that is present, a microcontroller that comprises a working clock pulse input at which the control clock pulse signal output by the voltage-controlled oscillator is present and that is formed to execute a program, stored in the microcontroller, with the control clock pulse frequency of the control clock pulse signal present at the working clock pulse input, where the program comprises the steps for generating and issuing an output clock pulse signal with an output clock pulse frequency that is in a predetermined division ratio to the control clock pulse frequency of the control clock pulse signal, a phase comparator at whose inputs the working clock pulse signal and the synchronous clock pulse signal are present and that is formed to generate and issue a DC voltage signal that is proportional to the phase difference of the signals present at the inputs, and an integration unit at whose input the DC voltage signal is present and that is formed to issue a control voltage that is proportional to the time integral of the DC voltage signal over a predefined time span, where the control voltage is fed to the voltage-controlled oscillator.

The phase controller device according to the invention comprises a hardware core that is formed by the signal detector, the voltage-controlled oscillator, the phase comparator, and the integration unit, where the hardware core, by controlling the working clock pulse frequency of a microcontroller, brings the output clock pulse signal that is generated by the microcontroller into phase with the input clock pulse information that is received from the input data stream, and does so in such a manner that the jitter is low.

With this working clock pulse the microcontroller executes a stored program with which it generates the output clock pulse signal with an output clock pulse frequency that is in a predetermined division ratio to the control clock pulse frequency that is generated by the voltage-controlled oscillator and is given to the microcontroller as a working clock pulse frequency. In this way the program enables the phase controller device according to the invention to process, with a microcontroller, external periodic signals, data, or events, where the software processes taking place in the microcontroller are always locked in phase with the periodic occurrence of these external signals, data, or events. In so doing, the microcontroller only has to be fast enough that it executes the sequence of commands of the program stored in it in the time provided for this.

For the process of synchronization with the input clock pulse information in the serial input data stream no computing time is needed, in contradistinction to a software PLL implementation or interrupt-controlled synchronization with an output clock pulse signal taken from a PLL connected in incoming circuit.

The incorporation of the microcontroller into the phase controller device according to the invention makes possible, due to the programmability of the microcontroller, an easily realizable adaptation of the phase controller device to various instances of application.

Preferred embodiment examples of the phase controller device according to the invention are described in the following.

In a preferred form of embodiment the signal detector, the voltage-controlled oscillator, the phase comparator, and the integrator are formed as components separated from the microcontroller or as circuits of an integrated circuit, where these circuits are also separated from the microcontroller. In this way a rapid, low-jitter hardware core is formed around the microcontroller, where the hardware core brings the output clock pulse signal that is generated by the microcontroller into phase with the input clock pulse information from the input data stream.

In a preferred form of embodiment the signal detector is formed to recognize the input clock pulse information in the input signal that is received and to provide only the input clock pulse information in the form of the synchronous clock pulse signal at its output.

In an additional preferred form of embodiment the microcontroller is formed to generate a clock pulse signal that is to be sampled and that is in a fixed phase relation to the output clock pulse signal and whose frequency is a predetermined multiple of the output clock pulse signal. In this way it is made possible to synchronously sample the serial input data stream symbol by symbol. Due to the low phase jitter it is possible to sample particularly narrow data signals in a reliable manner.

In an additional preferred form of embodiment the microcontroller comprises in addition a data sampling device that is fed the clock pulse signal that is to be sampled and the input signal and is formed to extract content data symbols from the input data stream with the clock pulse given by the clock pulse signal that is to be sampled and to output those content data symbols at an output. The output data can subsequently be fed to further processing or reproduction.

In an additional preferred form of embodiment the data sampling device is formed in the form of a first gate circuit that has a closed stated in which no signal is present at the output and an open state in which the input signal is present at the output and that, on arrival of a signal that is to be sampled, assumes the open state for a predetermined period of time and otherwise is in the closed state.

In an additional preferred form of embodiment the data sampling device is formed as a sampling and holding element that is fed the input signal and the signal that is to be sampled and that is formed to sample, with each new signal that is to be sampled, the current input signal and to output the result of the sampling until the arrival of the next signal that is to be sampled at the output.

In an additional preferred form of embodiment the phase comparator is formed to generate the DC voltage signal with a DC voltage value that is proportional to the phase difference of the output clock pulse signal and the synchronous clock pulse signal relative to the temporal center of the synchronous clock pulse signal.

In this embodiment example the clock pulse signal that is to be sampled and that is generated by the microcontroller is considered as phase-synchronous with the synchronous clock pulse signal when it is temporally centered over the synchronous clock pulse signal.

Along with this, the width of the clock pulse signal that is to be sampled is preferably greater than the widest synchronous clock pulse signal to be expected. This is of advantage above all when the width of the synchronous clock pulse signal is not constant due to noise in the transmission path, as is the case, for example, in wireless data transmission, in which the width is usually dependent on the intensity of reception of the signal transmitted in analog format. In this way, even in case of varying conditions of transmission, the extraction of content data from the input data stream at the time that is optimal in each case is made possible. This ensures input signal sampling with a low number of errors.

In an additional preferred form of embodiment the phase comparator is, in addition, formed to issue, at one output, a lock signal that indicates that at the moment the phase difference between the synchronous clock pulse signal and the output clock pulse signal is zero or undershoots a given threshold value.

In an additional preferred form of embodiment a second gate circuit is connected, in incoming circuit, to a signal detector, where the input signal and an enable signal are fed to the gate circuit and the gate circuit is formed to issue no output signal when it is in the closed state and to issue the input signal as an output signal when it is in the open state, to assume the open state when an enable signal is not present, and to assume the closed state when an enable signal is present.

In this embodiment example it is the case that when the phase controller device is locked, the detection of the input clock pulse information from the input data stream is disabled, in each case for a period of time of somewhat less than the period of the input clock pulse frequency as calculated from the time of the simultaneous arrival of the synchronous clock pulse signal and the output clock pulse signal on. In this way an active noise suppression is realized that pre-vents a false detection of noise, as input clock pulse information, in the input signal or the detection of bit sequences that are only similar to input clock pulse information due to random fluctuation. The input clock pulse information is only detected when it is expected.

In an additional preferred form of embodiment a signal is fed to the microcontroller, where that signal represents information concerning the value of the control voltage. For example, a limit device can be connected, in outgoing circuit, to the integration unit, where the limit device indicates with two output bits whether the phase-locked loop is in a predefined permitted operational range and in which direction, in given cases, there is a deviation from the permitted operational range. Both bit signals are fed to the microcontroller. The program stored in the microcontroller comprises an additional step in adapting the division ratio of the control clock pulse signal and the output clock pulse signal as a function of the information concerning the level of the control voltage. In this way the trap range of the phase controller device can be increased considerably without increasing the phase jitter. The achievable extension of the trap range is clearly greater than would be possible solely with the aid of the voltage-controlled oscillator. To obtain information concerning the direction of the frequency offset it is advantageous in this embodiment example to provide a second PLL branch that comprises a synchronization detector, phase comparator, charge pump, and discriminator but does not comprise the noise suppression mentioned above since the noise suppression prevents the recognition of the state "frequency too high" because unexpectedly frequent synchronization pulses will be suppressed. If the hardware of the PLL is embodied as an ASIC (Application Specific Integrated Circuit) or a FPGA (Field Programmable Gate Array, logic array), then the expenditure for the additional PLL branch is minimal.

A receiver device according to the invention comprises an antenna that is formed to receive input signals in the form of radio signals and comprises a phase controller device that is in accordance with the first aspect of the invention and whose signal detector is connected to the antenna. Preferred embodiment examples of the receiver device according to the invention and its advantages follow from the above description of the embodiment examples of the phase controller device according to the invention.

According to a second aspect of the invention one provides a control method for synchronizing a to-be-issued output clock pulse signal with an input signal that represents a serial input data stream comprising input clock pulse information and content data, where that control method comprises a loop comprising the following steps:

identifying input clock pulse information that is comprised in the input signal and issuing a synchronous clock pulse signal that is synchronous with the identified input clock pulse information, executing, clocked by a control clock pulse signal, a program stored in the microcontroller, where that program comprises steps for generating and issuing an output clock pulse signal with an output clock pulse frequency that is in a predetermined division ratio to the control clock pulse frequency of the control clock pulse signal, comparing the phase relations of the output clock pulse signal and the synchronous clock pulse signal and generating a DC voltage signal proportional to their phase difference, generating a control voltage that is proportional to the time integral of the DC voltage signal over a predetermined interval of time, generating the control clock pulse signal and issuing it to the microcontroller, where the control clock pulse frequency is proportional to the control voltage.

The advantages of the control method according to the invention follow from the above description of the advantages of the phase controller device of the first aspect of the invention. Embodiment examples of the control method according to the invention will be described in the following.

In a preferred form of embodiment of the control method according to the invention the microcontroller generates in addition a clock pulse signal that is to be sampled and is in a fixed phase relation to the output clock pulse signal. In one embodiment example the frequency of the signal that is to be sampled can be a predetermined multiple of the output clock pulse signal.

In an additional preferred form of embodiment content data symbols are extracted from the input data stream of the input signal with the clock pulse given by the clock pulse signal that is to be sampled.

In an additional preferred form of embodiment the microcontroller issues the phase-locked clock pulse signals that are to be sampled, and issues them in such a manner that they are temporally centered relative to an expected duration of an input signal representing a content data symbol.

In an additional preferred form of embodiment a lock signal is generated when at the moment the phase difference between the synchronous clock pulse signal and the output clock pulse signal is zero or undershoots a given threshold value.

In an additional preferred form of embodiment, information concerning the level of the control voltage is fed to the microcontroller and the program stored in the microcontroller comprises an additional step for adapting the division ratio of the control clock pulse signal and the output clock pulse signal as a function of the control voltage that is present.

In an additional preferred embodiment example, which in particular represents a concretization of the form of embodiment last described, a first limit signal is issued when the control voltage has reached an upper limit and a second limit signal is issued when the control voltage has reached a lower limit, and the program stored in the microcontroller comprises additional steps for decreasing the division ratio in the presence of a limit signal of the first type and increasing the division ratio in the presence of a limit value of the second type.

In the following, additional preferred embodiment examples of the phase controller device according to the invention are described in more detail with reference to the figures. Shown are:

FIG. 1 a simplified block diagram of an embodiment example of a phase controller device according to the invention, FIG. 2 a detail of a diversity receiver with a phase controller device according to the invention, FIG. 3 a detailed block diagram of the integrator circuit from FIG. 1 and FIG. 4 a time diagram to explain the temporal relationships of various internal signals that are generated by the phase controller device of FIG. 1 for input clock pulse information that is comprised in an input signal that is received.

Figure 1:
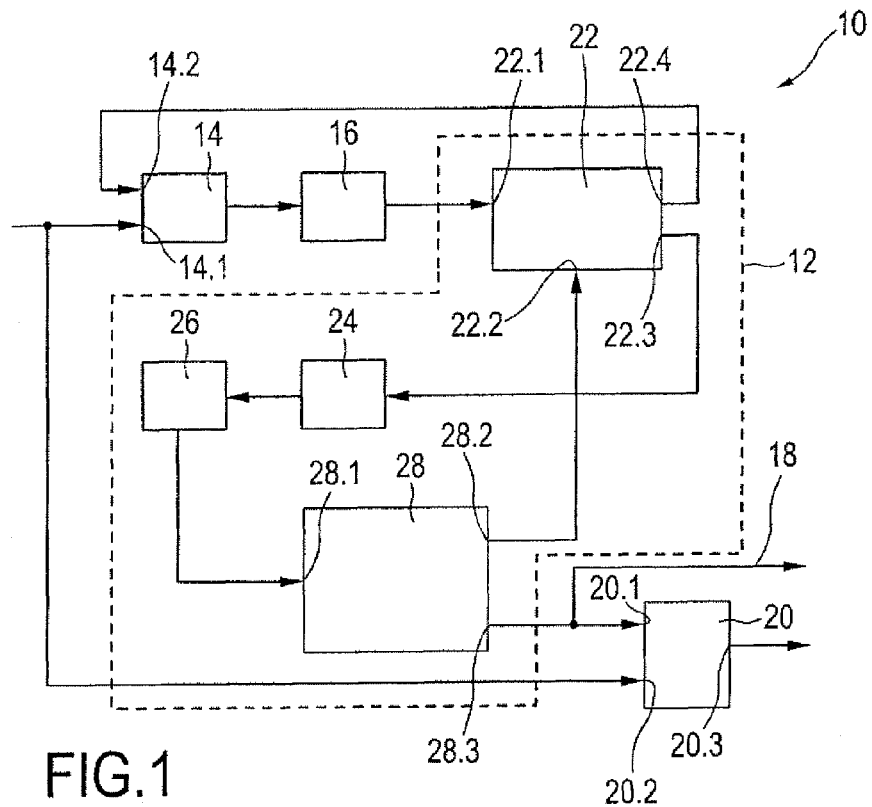

FIG. 1 shows a simplified block diagram of a phase controller device 10 according to the invention. The phase controller device comprises a phase-locked loop 12, which in the following will also be denoted by the abbreviation PLL, where a first gate circuit 14 and a signal detector 16 are connected, in incoming circuit, to the PLL 12. At an output 18 of the PLL a regenerated data clock pulse is present in the form of a signal that is to be sampled. The signal that is to be sampled is fed in parallel to a data sampling device in the form of a second gate circuit 20 at its first input 20.1. The input signal fed in parallel to the first gate circuit 14 is also present at a second input 20.2 of the second gate circuit 20.

The structure of the PLL 12 will be explained in more detail in the following. The PLL 12 has a phase comparator 22 at whose first input 22.1 the output signal of the signal detector 16 (synchronous clock pulse signal) is present and at whose second input 22.2 the output clock pulse signal of the microcontroller 28 is present. An integrator 24 is connected, in outgoing circuit, to this phase comparator. A voltage-controlled oscillator (VCO) 26 is connected at its control input to the integrator 24. The output of the VCO 26 is fed to a clock pulse input of a programmed microcontroller 28. The program that is comprised in the microcontroller implements the function of a programmable digital frequency divider. Generated with the aid of the program, an output clock pulse signal of the microcontroller is conducted back to a second input of the phase comparator 22, whereby the loop of the PLL 12 is closed.

The functionality of the phase controller device 10 during its operation will be explained in the following. For the purposes of the following description we choose, as an example of an input signal of the phase controller device 10, a serial data stream that has been transmitted by means of radio technology and comprises input clock pulse information in the form of several sequential synchronous features. For a more detailed explanation, reference is made to FIG. 4a). In that figure an input signal E is represented in a time diagram. The input signal E comprises data words, of which the data words W1 and W2 are represented as signal groups in FIG. 4a). The data words W1 and W2 are generated on the transmitter side with a characteristic time structure. This time structure is drawn upon by the phase controller device 10 in the synchronization. Characteristic features of the time structure of the data words are:

- a temporal distance $T_{Pause}$ of the data words W1 and W2 (as well as all the other data words) from one another represented by a 14-µs-long signal pulse, a prestart bit V at the beginning of each data word as well as
- following the prestart bit V in each data word, a start bit S, which is represented by a signal pulse with a duration of 4.5 µs and can be distinguished from the prestart bit by its short duration.

However, the area of application of the device of FIG. 1 is obviously not limited to the signal structure described, or to synchronization with input signals transmitted by means of radio technology.

The first gate circuit 14 is initially in its open state. A received signal E (cf. FIG. 4a) that is present at its input 14.1 is present without change at its output and is transmitted further to the signal detector 16.

The signal detector 16 is formed to recognize the combination of the three stated features of the input clock pulse information in the input signal E. In so doing, the pause is recognized first on the basis of its predefined duration $T_{Pause}$ of, for example, 70 ms. If a pause has been recognized, there is next a check for the presence of a prestart bit. When checking for the presence of the prestart bit, use is made of the information, known in advance to the recipient, that only the signal pulse that represents the prestart bit V has a duration of more than 9.8 µs (specifically 14 µs). If the prestart bit has been recognized, the start bit arriving at the input of the signal detector is subsequently conducted to the output of the signal detector 16.

Figure 4:
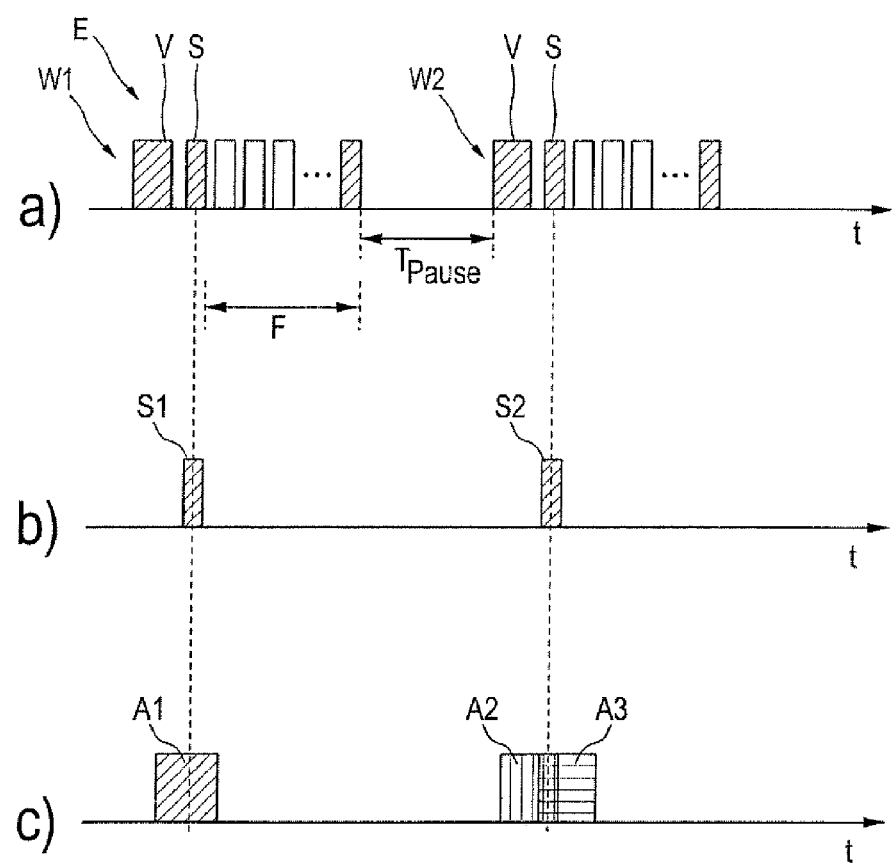

The output signal of the signal detector 16 forms the control clock pulse signal fed to the PLL 12 and is represented in FIG. 4b). The control clock pulse signal consists only of the short signal pulse that occurs periodically in the input signal E. This short signal pulse represents the respective start bit S of the arriving data words and is always output synchronously with it.

In the PLL 12 the phase comparator 22 receives, at its input 22.1, the control clock pulse signal and, at its input 22.2, the output clock pulse signal that is generated by the microcontroller 28. The phase comparator is formed to generate and issue, at its output 22.3, a DC voltage signal that is proportional to the phase difference of the signals present at its inputs 22.1 and 22.2. The output signal of the phase comparator therefore comprises information concerning the sign and the magnitude of the phase difference of the synchronous clock pulse signal and the output clock pulse signal of the microcontroller 28. The phase difference can be determined in the case of rectangular signal pulses simply by measuring the time lag in the arrival of the synchronous clock pulse signal at the input 22.1 and the output clock pulse signal at the input 22.2 of the phase comparator 22.

The DC voltage signal that is generated by the phase comparator 22 is conducted to the integrator 24. The integrator 24 forms a low-pass filter and has present at its output a control voltage that is proportional to the time integral of the DC voltage signal present at the input. The control voltage is present at the control input of the VCO 26, whose output control clock pulse signal is varied according to the level of the control voltage.

The control clock pulse signal is present at the clock pulse input 28.1 of the microcontroller 28. The microcontroller executes a program that is stored in it, where by means of this program the microcontroller implements within the PLL 12 the function of a (programmable) frequency divider. In the present presentation the programmability will be excluded from consideration initially. It is therefore assumed initially that the microcontroller forms a frequency divider with a fixed division ratio. It is important that all the activities of the microcontroller are clocked by the control clock pulse signal at the input 28.1. In this way the microcontroller 28 generates its output clock pulse signal, which it conducts back, via its output 28.2, to the input 22.2 of the phase comparator 22. The output clock pulse signal is a rectangular pulse with a duration that is greater than the duration of the synchronous clock pulse signal that is given by the signal detector 16 to the input 22.1 of the phase comparator. The synchronization is then produced when the temporal centers of the output clock pulse signal and the synchronous clock pulse signal coincide. This situation is represented in FIG. 4c) in the example of the output clock pulse signal A1, whose temporal center coincides with that of the synchronous clock pulse signal S (FIG. 4b)). This has the advantage that reception-related variations of the duration of the synchronous clock pulse signal have no influence on the phase relation of the output clock pulse signal to the synchronous clock pulse signal. If, instead of this, one were to synchronize on an edge of the synchronous clock pulse signal, there would be such an influence, due to which the stability of the synchronization would be reduced.

FIG. 4c) shows, with the output clock pulse signals A2 and A3, two cases in which the synchronization is still not produced. The output clock pulse signal A2 arrives at the input 22.2 before the synchronous clock pulse signal S2 is detected at the input 22.1 of the phase comparator 22. In this case the phase comparator 22 will apply at its output a corresponding DC voltage, which is fed, via the integrator 24, to the voltage-controlled oscillator 26 and leads to a reduction of the control clock pulse frequency of the control clock pulse signal that is generated by the voltage-controlled oscillator. As a consequence of this, the microcontroller 28 will reduce the output clock pulse frequency of the output clock pulse signal at its output 28.2. Later output clock pulse signals will thus be better synchronized with the control clock pulse signal. In case of a temporally delayed arrival of the output clock pulse signal at the phase comparator 22 the PLL will react in an analogous manner but with the opposite sign, as is represented in the example of the output clock pulse signal A3 in FIG. 4c). In this case the output clock pulse signal of the phase comparator 22 will lead, via the integrator and the VCO 26, to an increase of the output clock pulse frequency of the microcontroller 28. In this way it is managed to synchronize the output clock pulse signal of the microcontroller 28 with the synchronous clock pulse signal and thus with the input signal.

The microcontroller 28 outputs at its output 28.3 a signal that is to be sampled and that has a clock pulse frequency that corresponds to the temporal spacing of the individual signal pulses within the data words W1 and W2. The signal that is to be sampled and that is present at the output 28.3 is always synchronous with the clock pulse of the signal pulses within the received data words as long as the output clock pulse signal is synchronous with the input clock pulse signal. In this way, with the aid of the second gate circuit 20, the individual signal pulses that are received at its input 20.2 can be correctly identified and the individual content data bits that are comprised in the data word can be detected. The regenerated content data bits are output at the output 20.3 of the second gate circuit 20 for further processing.

In the phase controller device in FIG. 1, in order to suppress sources of noise, an enable signal is generated at an output 22.4 of the phase comparator 22 and applied at the input 14.2 of the first gate circuit 14, then, after the synchronous clock pulse signal and the output clock pulse signal have arrived, the enable signal sets the first gate circuit 14 into a closed state for a period of time somewhat less than that from the end of the start bit up to the beginning of the next pause. An example of a suitable time window is indicated in FIG. 4a) with the reference letter F. In this way it is prevented that random similarities of input signal pulses in the data stream are interpreted as input clock pulse information and corrupt the control voltage. Thus active noise blanking is realized. Control information for controlling the gate is obtained using the information "synchronous sequence terminated" from the signals of the input clock pulse disconnect and the phase comparison circuit.

In an extension of the embodiment example of FIG. 1 the microcontroller implements a programmable frequency divider. In this extension a window discriminator that is not represented here is connected, in outgoing circuit, to the integration unit 24, where that window discriminator generates and issues a first limit value signal that indicates that the control voltage has reached an upper limit value and a second limit value signal that indicates that the control voltage has reached a lower limit value. The first and second limit value signals are fed, via inputs that are not represented, to the microcontroller 28. The program stored in the microcontroller comprises, in addition to the functionality that has been described, steps for reducing the division ratio when the first limit value signal is present and increasing the division ratio when the second limit value signal is present. In this way the microcontroller 28 can expand the trap range of the PLL clearly beyond the extent that is offered by the control band width of the voltage-controlled oscillator.

Figure 2:
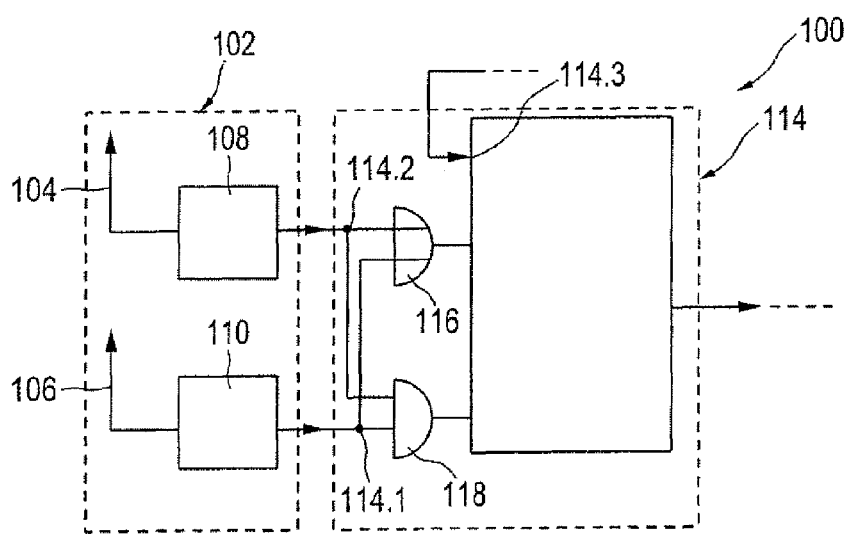

FIG. 2 shows a possibility for using the phase controller device in FIG. 1 in the form of a diversity receiver 100. Only parts that are different from or added to the circuit in FIG. 1 are represented. These are the receiver part 102 and a first stage 114 of the synchronization signal detector.

The receiver part 102 comprises two antennas 104 and 106 and, connected to them in outgoing circuit, respective receiver circuits 108 and 110 that perform the functions of demodulation and binarization in a known manner. The two antennas 104 and 106, like the receivers 108 and 110, are tuned to one and the same transmitting frequency. The two antennas 104 and 106 are located at different points of reception in order, in accordance with the diversity principle, to make continuous reception possible independently of local cancellation, of the received transmission signals by equal-amplitude, opposite-phase echoes of these received transmission signals. The signals output by both receiver circuits form two input signals of the phase controller device.

The circuit 114 of the receiver 100 is connected, in incoming circuit, to the first gate circuit of the phase controller device of FIG. 1. First of all, two inputs 114.1 and 114.2 for input signals of the two receiver circuits 108 and 110 are provided. Furthermore, the input signals are combined with one another, in one case via an OR gate 116 and in the other case via an AND gate 118. The OR-gating serves to detect the state "1" for the prestart bit and the start bit. A prestart bit is detected by the signal detector if a prestart bit coming from one of the receiver circuits 108 or 110 or from both receiver circuits 108 or 110 is present. The AND-gating serves to detect the state "0" for the pause. A pause is detected only when both input signals of 108 and 110 indicate the presence of a pause. Through this logic the noise-tolerance of the receiver is increased.

Figure 3:
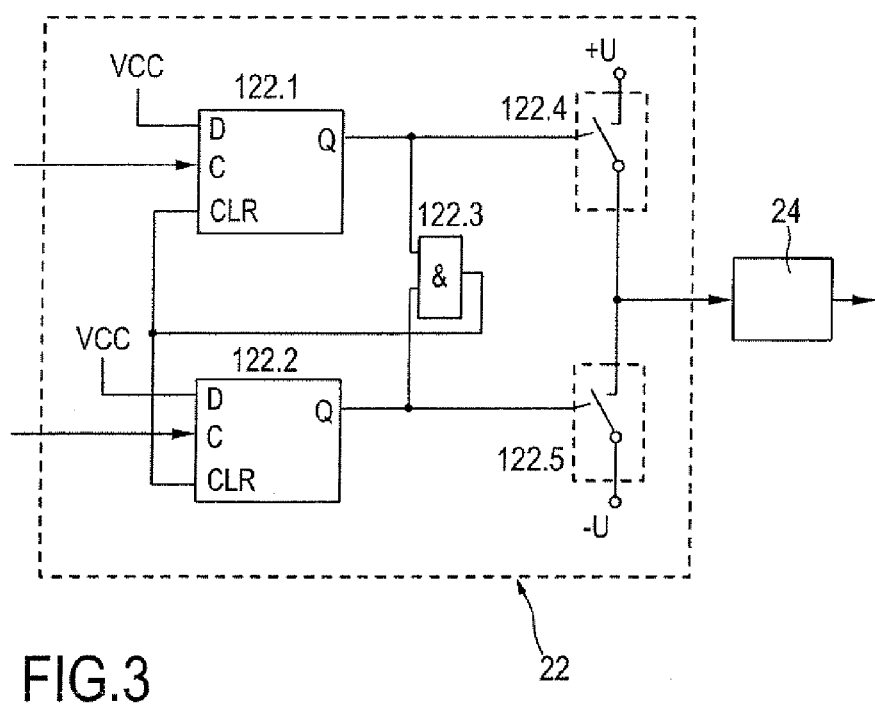

The phase comparator 22 functions according to the principle of the charge pump, which is represented in its simplest form in FIG. 3. The synchronous clock pulse signal 22.1 and the output clock pulse signal 22.2 are each fed to a flip-flop and on their arrival (rising edge of the respective signal) each switch the flip-flop into its first stable state (that is, a "1" set at its output). Depending on which of the two signals 22.1 or 22.2 arrives first, flip-flop 122.1 or 122.2 is set first and thus closes the switch 122.4 or 122.5. If the second signal arrives after the first, then both outputs of both flip-flops are set in that state. With this, however, both inputs of the AND gate 122.3 are set to a logical 1, and consequently this gate generates a logical "1" at the output which in turn instantaneously resets both flip-flops.

Depending on which clock signal 22.1 or 22.2 arrives first, a positive or a negative current can flow into the integrator 24, where that current flow is terminated by the arrival of the respective delayed clock signal and where duration of that current flow depends on the difference in the time of arrival, that is, on the current phase relation. If both clock signals arrive simultaneously, then no current flows in the direction of the integrator 24 since the flip-flops are cleared instantaneously by means of the AND gate 122.3. As can be seen, the signals are in phase in a circuit according to FIG. 3 if the front edges of both clock pulse signals coincide temporally, that is, if both clock pulse signals begin at the same time.

Figure 5:
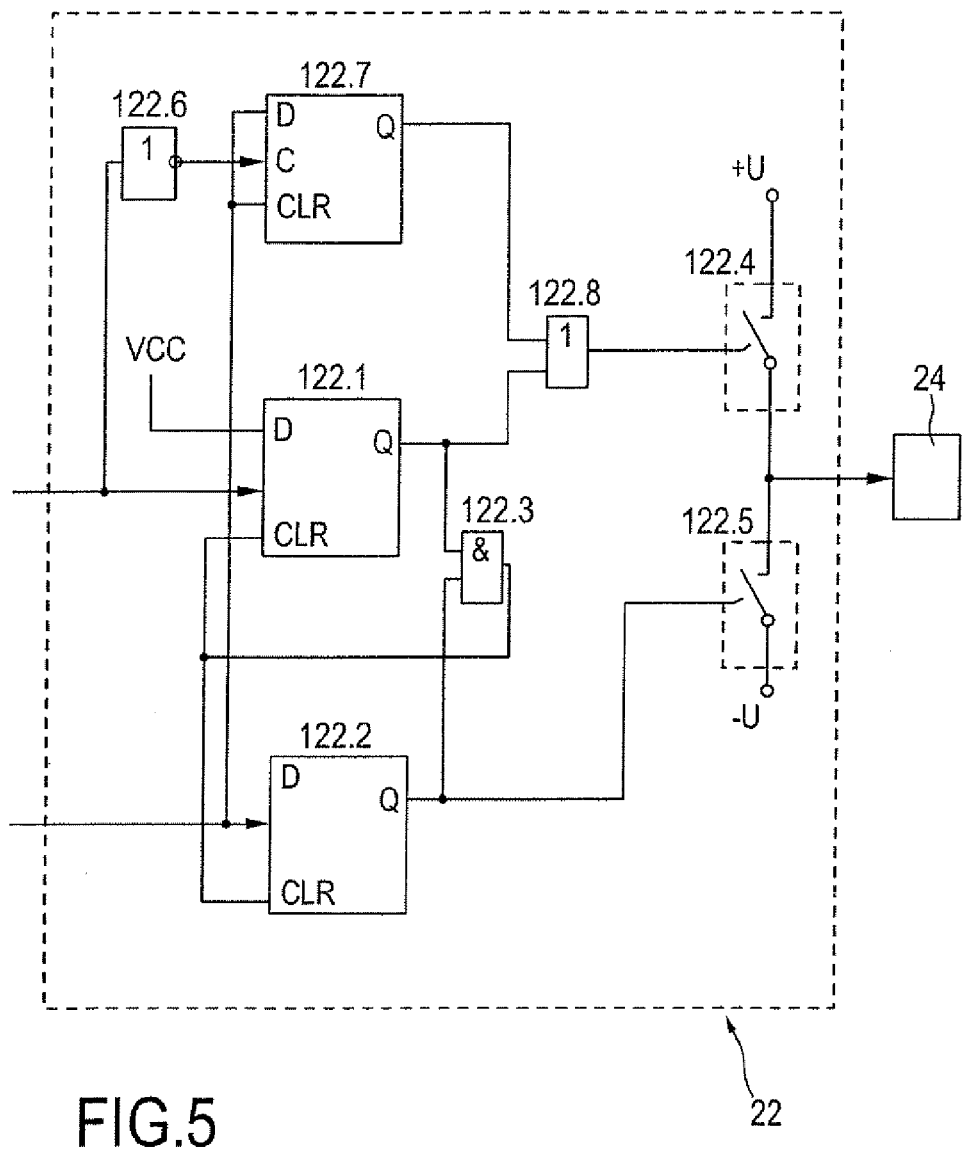
FIG. 5 shows a variant of a charge pump, where this variant in modified in the sense of the invention.
Figure 6:
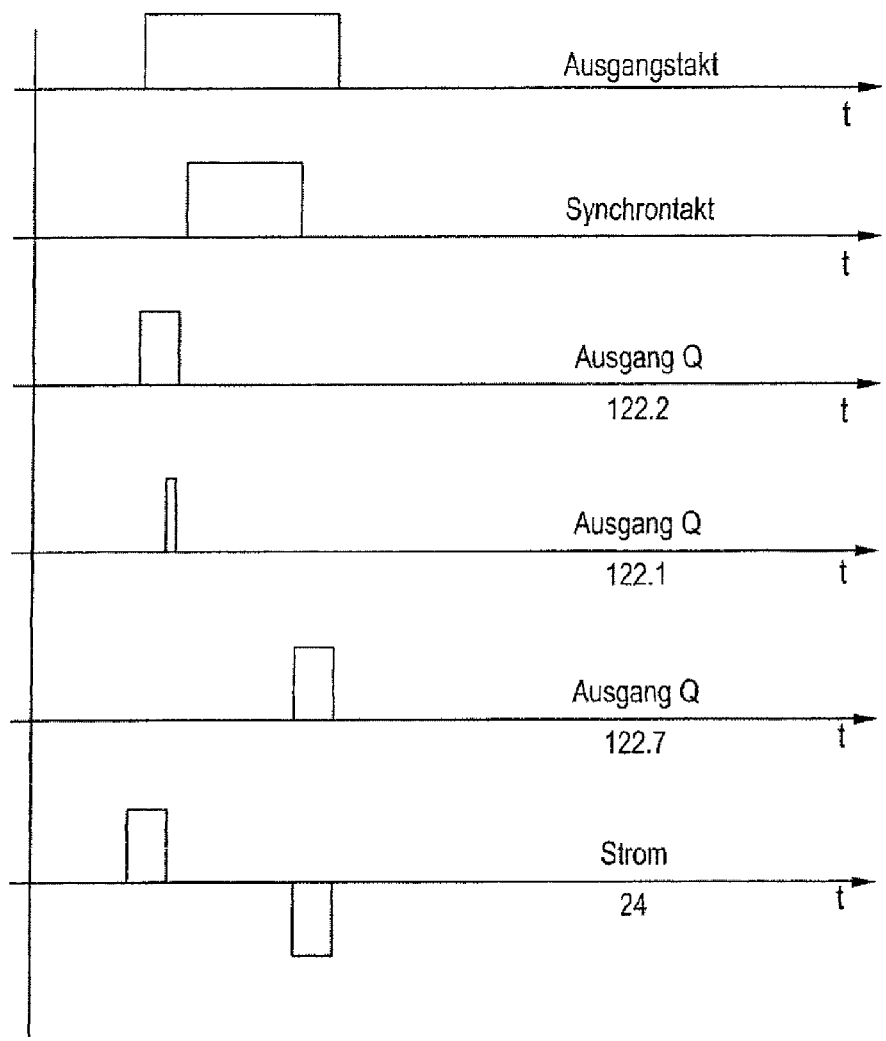
FIG. 6 shows a pulse diagram.

FIG. 5 shows a variant of the charge pump, where that variant in modified in the sense of the invention. An additional flip-flop 122.7, an inverter 122.6, and an OR gate 122.8 have been added. The pulse diagram in FIG. 6 shows the desired case of synchronicity, that is, the output clock pulse signal is temporally centered with respect to the synchronous clock pulse signal. For this, the clock pulse signal that is to be sampled must begin temporally before the synchronous clock pulse signal. According to the explanation above, this has as a consequence the fact that first a negative current flows in the direction of the integrator for the time t1 (FIG. 6). This must be compensated by an equally large positive current in the case of the temporal relations represented in FIG. 6. The flip-flop 122.7 provides for this. This flip-flop receives, at its clock pulse input, the synchronous clock pulse signal that is negated by the negator 122.6 and receives, at its data input, the output clock pulse signal. In the case that with a falling edge of the synchronous clock pulse signal the output clock pulse signal still carries the state "1," the flip-flop 122.7 is set. Subsequently, it is reset if the output clock signal goes to a logical 0 (see FIG. 6). Since the two outputs of flip-flop 122.1 and 122.7 are fed OR-gated to the switch 122.4, a positive current flows for this period of time. Thus, as represented in FIG. 6, the temporal sequence of the synchronous clock pulse signal and the output clock pulse signal represents the state "PLL locked" for the circuit in FIG. 5.

If the synchronous clock pulse signal is absent, e.g., due to noise in the transmission path from the data transmitter to the data receiver, then flip-flop 122.2 would in fact be set by the output clock pulse signal but would not be reset by the synchronous clock pulse signal and a negative current would flow in the direction of the integrator on a sustained basis. When this happens, the VCO would-oscillate at its lowest frequency. This is the known behavior of the flip-flop-controlled charge pump and is undesirable in the present case.

Figure 7:
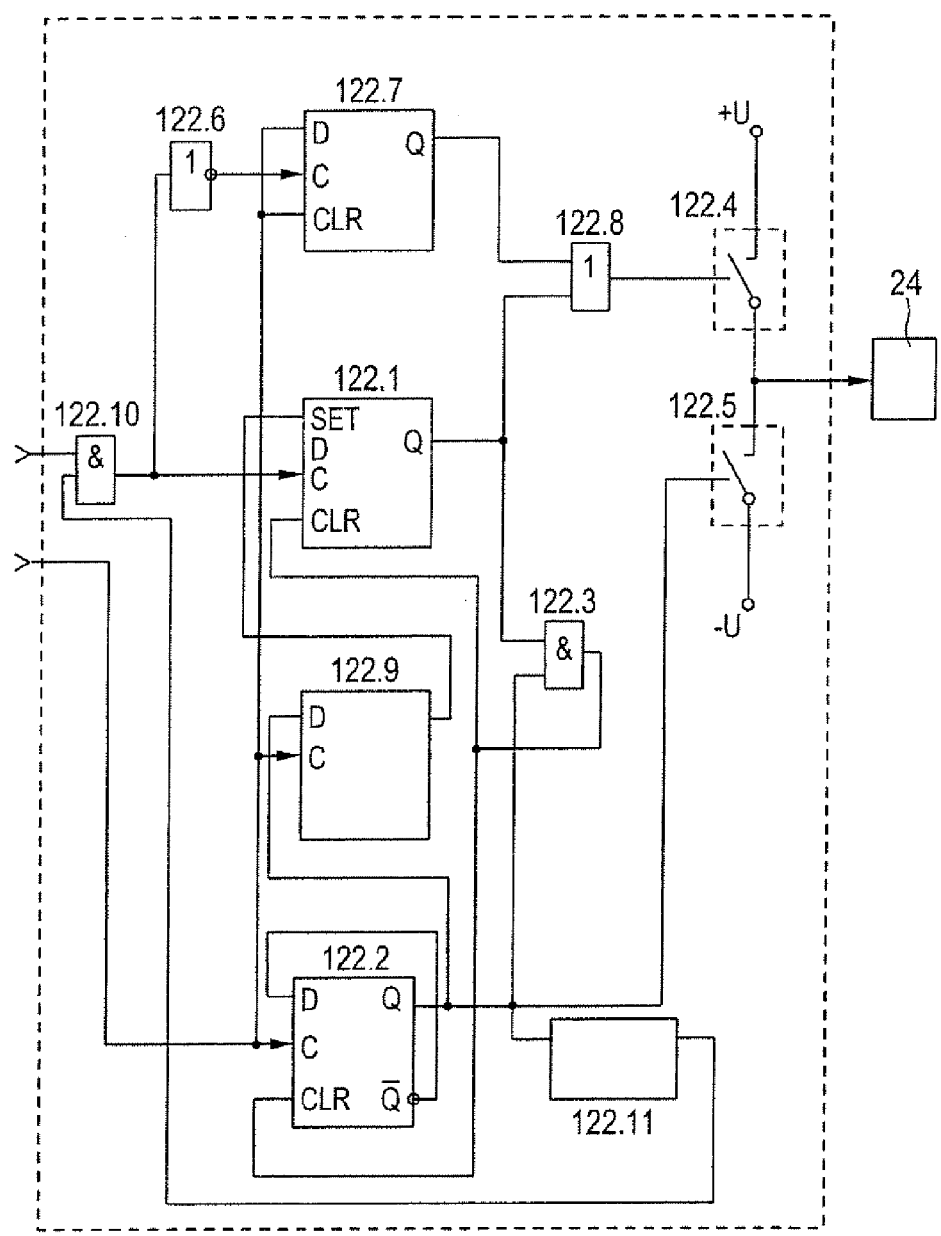
FIG. 7 shows an additional modified variant of the basic circuit from FIG. 3.

FIG. 7 shows an additional modified variant of the basic circuit from FIG. 3, where that variant comprises the elements from FIG. 6 and has been enhanced by an additional flip-flop 122.9 and an AND gate 122.10 functioning as a gate. Subject to the condition that the flip-flop 122.9 is not set and the flip-flop 122.2 is also not set initially, the function of the variant is identical to the function explained for the circuit of FIG. 6. What is new is the fact that the flip-flop 122.2 is no longer connected by its data (D) connection to the VCC but rather to the negated output of the flip-flop 122.2. That has as a consequence the fact that with a rising edge at the clock pulse input the flip-flop 122.2 of the state other than the present state is assumed in each case (the flip-flop toggles). When the synchronous clock pulse signal is present this initially represents no behavior that is modified with respect to the circuit according to FIG. 6 since the flip-lop 122.2 is always reset by the AND gate 122.3 when the output clock pulse signal and the synchronous clock pulse signal have arrived in sequence.

However, in the absence of the synchronous clock pulse signal (signal schema according to FIG. 6), then the flip-flop 122.2 is still always set when the output clock pulse signal arrives the next time. A negative current flowed into the integrator precisely for the duration of one period of the output clock pulse signal. However, the output clock pulse signal of the flip-flop 122.2 is now present at the data input of the flip-flop 122.9. The rising edge of the output clock pulse signal at the still not cleared flip-flop 122.2 has as a consequence the fact that the flip-flop 122.9 is set, which for its part lies with its output at the setting input of the flip-flop 122.1. Thus, the flip-flop 122.1 is set. Now both the flip-flop 122.1 and the flip-flop 122.2 are set and are reset via the AND gate 122.3. Since at the setting input of the flip-flop 122.1 logical "1" is still always present from the still always set flip-flop 122.9, the flip-flop 122.1 is still set while the flip-flop 122.2 remains reset. A positive current then flows into the integrator. This state remains for one period of the output clock pulse frequency.

If the next rising edge of the output clock pulse signal arrives, then flip-flop 122.9 is reset. At its D/data input there is indeed still a logical "0" from the output of the flip-flop 122.2. The flip-flop 122.2 is set and because flip-flop 122.1 and flip-flop 122.2 are set, both flip-flops are reset after the combining of their output signals by the AND gate 122.3.

For the then following period of the output clock pulse signal no current flows into the integrator. As is to be inferred from the explanation above, in the absence of a synchronous clock pulse signal a negative current first flows into the integrator for one period of the output clock pulse signal, then for the next period a positive current, and then in turn for the next period no current. If the currents are well balanced, then in the absence of a synchronous clock pulse signal the charge state of the integrator remains unchanged and thus the frequency of the VCO remains constant. The pulse length detector 122.11 monitors the output of the flip-flop 122.2 and generates, in the case that the duration of a negative current flow into the integrator exceeds a certain value, a blanking pulse of approximately the length of the output clock pulse signal that is fed to the AND gate 122.10 and with this disables, for just this time, the further transmission of the synchronous clock pulse signal. Thus it is ensured that the above-described sequence of positive and negative current flow of equal length is not disturbed by synchronous clock pulse signals that arrive in between. This principle has proven itself in practical use to be extraordinarily resistant to noise.

The invention claimed is:

1. Phase controller device for the phase-locked synchronization of an output clock pulse signal with an externally derived input signal that represents a serial input data stream comprising input clock pulse information and content data, wherein the phase controller device comprises:

a signal detector configured to receive said externally derived input signal, said externally derived input signal comprising input clock pulse information, and further configured to output a synchronous clock pulse signal that is synchronous with the input clock pulse information;

a voltage-controlled oscillator configured to supply a control clock pulse signal with a control clock pulse frequency that is proportional to a control voltage;

a microcontroller comprising a working clock pulse input at which the control clock pulse signal supplied by the voltage-controlled oscillator is present, said microcontroller configured to execute a program with the control clock pulse frequency of the control clock pulse signal present at the working clock pulse input, wherein the program comprises steps for generating and issuing said output clock pulse signal having an output clock pulse frequency that is in a predetermined division ratio to the control clock pulse frequency of the control clock pulse signal;

a phase comparator comprising inputs configured to receive the output clock pulse signal and the synchronous clock pulse signal, said phase comparator configured to generate and issue a DC voltage signal that is proportional to the phase difference of signals present at the inputs; and an integration unit comprising an input configured to receive the DC voltage signal, said integration unit configured to generate said control voltage that is proportional to the time integral of the DC voltage signal over a predefined time span, and wherein the control voltage is fed to the voltage-controlled oscillator.

2. The device according to claim 1, wherein the signal detector, the voltage-controlled oscillator, the phase comparator, and the integrator are formed as components separate from the microcontroller or as circuits of an integrated circuit, wherein the circuits are separate from the microcontroller.

3. The device according to claim 1, wherein the microcontroller is configured to generate a sampling clock pulse signal, wherein the sampling clock pulse signal is in a fixed phase relation to the output clock pulse signal.

4. The device according to claim 3, further comprising: a data sampling device configured to receive the sampling clock pulse signal and the input signal and to extract content data symbols from the input data stream with the clock pulse preset by the sampling clock pulse signal and to output the content data symbols.

5. The device according to claim 4, in which the data sampling device is formed as a sampling and holding element that is configured to receive the input signal and the sampling clock pulse signal and to sample the input signal and to output the result of the sampling until the arrival of a next sampling clock pulse signal.

6. The device according to claim 4, wherein the data sampling device comprises a first gate circuit configurable in a closed state in which no signal is present at the output and in an open state in which the input signal is present at the output, wherein the first gate circuit is configured to assume the open state for a predetermined period of time upon arrival of a sampling clock pulse signal and to assume the closed state otherwise.

7. The device according to claim 6, wherein the microcontroller is configured to generate phase-locked sampling clock pulse signals that are temporally substantially centered relative to an expected duration of an input signal representing a content data symbol.

8. The device according to claim 1, wherein the phase comparator is further configured to generate a lock signal that indicates when a phase difference between the synchronous clock pulse signal and the output clock pulse signal is zero or is below a given threshold value.

9. The device according to claim 8, in which a second gate circuit is connected as an input to a signal detector, and where the input signal and an enable signal are supplied to the gate circuit, where, after the arrival of the synchronous clock pulse signal and the output clock pulse signal at the phase comparator, the enable signal is suppressed for a period of time of less than one period of the frequency of the synchronous clock pulse signal in order to avoid faulty synchronization with portions of the input signal that are similar to the synchronous information and the gate circuit is configured to issue no output signal when it is in the closed state and to issue the input signal as an output signal when it is in the open state.

10. The device according to claim 9, in which information concerning the level of the control voltage is supplied to the microcontroller and the program stored in the microcontroller further comprises a step for adapting the division ratio of the control clock pulse signal and the output clock pulse signal as a function of the control voltage that is present.

11. The device according to claim 10, in which:
an arrangement is connected, in outgoing circuit, to the integration unit, where the arrangement is formed to generate and issue a first limit signal when the control voltage has reached an upper limit and to generate and issue a second limit signal when the control voltage has reached a lower limit;
the first and second limit signals are supplied to the microcontroller; and
the program stored in the microcontroller comprises additional steps for decreasing the division ratio in the presence of a limit signal of the first type and increasing the division ratio in the presence of a limit value of the second type.

12. The device according to claim 11, further comprising:
a receiver device, the receiver device comprising an antenna that is configured to receive input signals in the form of radio signals and being connected to the signal detector.

13. A method for synchronizing an output clock pulse signal with an input signal that represents a serial input data stream comprising input clock pulse information and content data, the method comprising a loop, wherein the loop comprises the following steps:
identifying input clock pulse information that is in the input signal and issuing a synchronous clock pulse signal that is synchronous with the identified input clock pulse information;
executing, clocked by a control clock pulse signal, a program stored in a microcontroller, where the program comprises steps for generating and issuing an output clock pulse signal with an output clock pulse frequency that is in a predetermined division ratio to the control clock pulse frequency of the control clock pulse signal;
comparing the phase relations of the output clock pulse signal and the synchronous clock pulse signal and generating a DC voltage signal proportional to their phase difference;
generating a control voltage that is proportional to the time integral of the DC voltage signal over a predetermined interval of time; and
generating the control clock pulse signal and issuing it to the microcontroller, where the control clock pulse frequency is proportional to the control voltage.

14. The method according to claim 13, in which the microcontroller further generates a clock pulse signal that is in a fixed phase relation to the output clock pulse signal.

15. The method according to claim 14, in which content data symbols are extracted from the input data stream of the input signal with the clock pulse given by the clock pulse signal.

16. The method according to claim 15, in which the microcontroller issues phase-locked clock pulse signals that are substantially temporally centered relative to an expected duration of an input signal representing a content data symbol.

17. The method according to claim 16, in which a lock signal is generated when the phase difference between the synchronous clock pulse signal and the output clock pulse signal is zero or is below a given threshold value.

18. The method according to claim 17, in which the control voltage is supplied to the microcontroller and in which the program stored in the microcontroller further comprises a step for adapting the division ratio of the control clock pulse signal and the output clock pulse signal as a function of the control voltage.

19. The method according to claim 18, in which
a first limit signal is issued when the control voltage has reached an upper limit and a second limit signal is issued when the control voltage has reached a lower limit,
and in which the program stored in the microcontroller further comprises steps for decreasing the division ratio in the presence of a limit signal of the first type and increasing the division ratio in the presence of a limit value of the second type.

* * * * *